United States Patent
Gorcea et al.

[11] Patent Number: 6,137,359
[45] Date of Patent: Oct. 24, 2000

[54] LOW-DISTORTION HIGH-FREQUENCY AMPLIFIER

[75] Inventors: Dan Gorcea, Kanata; Robert M. Thomas, Nepean, both of Canada

[73] Assignee: Nortel Networks Corporation, Montreal, Canada

[21] Appl. No.: 09/457,000

[22] Filed: Dec. 7, 1999

Related U.S. Application Data

[62] Division of application No. 09/158,838, Sep. 23, 1998.

[51] Int. Cl.[7] ....................................................... H03F 3/45
[52] U.S. Cl. ............................ 330/252; 330/260; 327/103
[58] Field of Search ................................. 330/252, 260, 330/295, 311, 149, 288, 84; 327/103

[56] References Cited

U.S. PATENT DOCUMENTS

3,526,847  9/1970  Campbell ................................. 330/260

Primary Examiner—Robert Pascal
Assistant Examiner—Henry Choe

[57] ABSTRACT

The invention is an amplifier configuration which provides signal gain at very low levels of distortion. The inventive amplifier configuration consists of two amplifiers whose outputs are added to give the total amplified signal. A first amplifier functions in the usual way, amplifying a signal from a voltage source and having a controllable feedback gain. A second amplifier is also fed by the voltage source but applies a feedback gain to the total amplified signal rather than to its own output signal. By selecting the feedback gains to be substantially identical, portions of voltage waveforms that have been removed or altered due to clipping or other forms of distortion are restored by the second amplifier. The invention is particularly useful when amplifier gain is low, e.g., at high frequencies. Suitable implementations are in the voltage domain, using operational amplifiers, or in the current domain, using, for example, voltage-controlled current sources.

11 Claims, 10 Drawing Sheets

LOW-DISTORTION HIGH-FREQUENCY AMPLIFIER

This application is a division of application Ser. No. 09/158,838, filed Sep. 23, 1998.

FIELD OF THE INVENTION

The present invention relates to analog amplifiers and particularly to an amplifier circuit which produces a reduced level of distortion.

BACKGROUND OF THE INVENTION

Analog amplifiers have many applications in communications systems, often being found in transmitters and receivers. At a transmitter, for example, an analog amplifier may be placed between a digital-to-analog converter and a transduction means (e.g., an electro-optic converter, an antenna or a microphone), while at a receiver, an analog amplifier can be found between the appropriate transduction means (e.g., an antenna, an opto-electronic converter or a loudspeaker) and an analog-to-digital converter. An analog amplifier may also be directly connected to a metallic transmitting or receiving facility such as a twisted pair cable or a coaxial cable.

The quality of an amplifier is often determined by its "linearity", i.e., the accuracy with which the amplifier transforms a given input signal into an output signal of proportionally larger magnitude. However, nonlinear behavior, i.e., the production of distortion components or simply "distortion", may arise due to imperfections in the semiconductor devices forming part of the amplifier or because the properties of these devices change significantly as a function of instantaneous signal level. A more severe form of distortion, known as "clipping", arises when the input-output characteristic of an amplifier is linear only up to a certain input level, above which increases in input signal level will not produce further directly proportional increases in output signal level.

In the case of a transmission system used for sending analog signals such as voice or video, distortion can manifest itself in varying degrees, ranging from subtle reductions in the perceived quality of music signals to the total loss of intelligibility of voice signals, and so forth. In the context of multi-level digital transmission systems (e.g., quadrature amplitude modulation (QAM), vestigial sideband, single sideband or discrete multi-tone systems), distortion can cause degradation of the signal to the point beyond which the digital data becomes corrupted.

In addition, distortion products generated in a transmitter can appear outside of a frequency band assigned for transmission, thus causing interference to other signals sharing the same transmission medium. At a receiver, interfering signals outside the desired band are usually removed by filtering. While a significant improvement in performance can be achieved by using filters, such filters can become prohibitively expensive when the transmitter amplifiers induce large amounts of distortion.

Moreover, in a modern telecommunications system, it is not uncommon for amplifiers to be fed with signals having frequency content in the Megahertz range. Thus, analog amplifiers are frequently expected to perform well at high frequencies. However, it is known that amplifier open-loop gain drops off with frequency, and therefore little gain is available as the frequency of operation increases. Since the amount of distortion that can be attenuated is a direct function of the amount of open-loop gain available (when the amplifier is used in a feedback configuration), a reduction in open-loop gain reduces the capability of the amplifier to attenuate distortion, and hence it follows that the deleterious effects of distortion are magnified at higher frequencies.

In view of the above, there is clearly a need to limit amplifier-induced distortion, particularly at high frequencies. Unfortunately, various prior art attempts at doing so are unsatisfactory from the point of view of performance or cost (or both). For example, it would appear obvious that using components with improved linearity would solve part of the distortion problem. However, higher quality devices are not only more expensive, but unless their output range is increased, such amplifiers will still clip, causing the aforementioned distortive effects. On the other hand, increasing the output range of an amplifier while preserving its linearity entails a huge increase in cost, defeating the practicality of such an approach.

Another seemingly plausible solution is to add subsequent amplifier stages and to apply negative feedback around one or more stages. However, this requires that the open-loop gain be much larger than the closed loop gain of the amplifier stages equipped with feedback, a condition which is difficult to meet at high operating frequencies. Clearly, the onset of distortion remains both a common and serious problem, for which no adequate solution is taught by the prior art.

SUMMARY OF THE INVENTION

It is an object of the present invention to mitigate or obviate one or more disadvantages of the prior art.

Therefore, the invention may be summarized according to a first broad aspect as an amplifier circuit connectable between a voltage source and a load, comprising: voltage summing means having first and second inputs and having an output connectable across the load, wherein the voltage at the output is the sum of the voltages at the first and second inputs; a first amplifier having an input for connection to the voltage source and an output connected to the first input of the voltage summing means and having a first negative feedback circuit connected between the output and the input of the first amplifier, wherein the first amplifier has an open-loop gain ($A_1$) and the first negative feedback loop has a first feedback gain ($B_1$); and a second amplifier having an input for connection to the voltage source and an output connected to the second input of the voltage summing means and having a second negative feedback circuit connected between the output of the voltage summing means and the input of the second amplifier, wherein the second negative feedback loop has a second feedback gain (B2); wherein $A_1 B_1$ is substantially greater than one and wherein $$\frac{B_1}{B_2}$$

lies between approximately 0.75 and approximately 4.

According to a second broad aspect, the invention may be summarized as an amplifier circuit connectable between a voltage source and a load, comprising: voltage summing means having first and second inputs and having an output connectable across the load, wherein the voltage at the output is the sum of the voltages at the first and second inputs; a first amplifier having a noninverting input for connection to the voltage source, an output connected to the first input of the voltage summing means and a first negative feedback circuit connected between the output and an inverting input of the first amplifier, wherein the first amplifier has an open-loop gain ($A_1$) and the first negative feedback loop has a first feedback gain ($B_1$); and a second amplifier having a noninverting input for connection to the voltage source, an output connected to the second input of the voltage summing means and a second negative feedback circuit connected between the output of the voltage summing means and an inverting input of the second amplifier, wherein the second negative feedback loop has a second feedback gain ($B_2$); wherein $A_1B_1$ is substantially greater than one and wherein $$\frac{B_1}{B_2}$$

lies between approximately 0.75 and approximately 4.

The invention may be summarized according to a third broad aspect as a method of producing a final amplified electronic signal from an input electronic signal, comprising the steps of: simultaneously amplifying the input electronic signal by a first amplifier having an open-loop gain ($A_1$) and by a second amplifier, thereby to respectively produce first and second amplified signals; and adding the first and second amplified signals to produce the final amplified electronic signal; wherein the first amplifier has a feedback path from the first amplified signal, said feedback path having a selectable first feedback gain ($B_1$); wherein the second amplifier has a feedback path from the final amplified electronic signal, said feedback path having a selectable second feedback gain ($B_2$); wherein $A_1B_1$ is substantially greater than unity and wherein $$\frac{B_1}{B_2}$$

lies between approximately 0.75 and approximately 4.

According to another broad aspect, the invention may be summarized as an amplifier circuit for connection to a voltage source and to first and second terminals of a load, comprising: a main current source, having a first signal terminal for connection to the first terminal of the load, a second signal terminal and a control terminal for connection to the voltage source, the main current source having a gain ($G_1$); a first sensing resistor connected between the second signal terminal of the main current source and for connection to a reference voltage, the first sensing resistor having a resistance ($R_{S1}$); an auxiliary current source, having a first signal terminal for connection to the first terminal of the load, a second signal terminal for connection to the reference voltage and a control terminal; and a second sensing resistor for connection between the second terminal of the load and the reference voltage, the second sensing resistor having a resistance ($R_{S2}$); and a feedback circuit for connection to the second terminal of the load and connected to the control terminals of the main and auxiliary current sources for providing first and second feedback gains ($K_1$, $K_2$) to the first and second current sources, respectively; wherein $G_1K_1R_{S1}$ is substantially greater than unity and wherein $$\frac{K_1 R_{S1}}{K_2 R_{S2}}$$

lies between approximately 0.75 and approximately 4.

According to yet another broad aspect, the present invention may be summarized as an amplifier circuit connectable between a signal source and a load, comprising: a first amplifier having first and second inputs, an output and a feedback circuit, the first input being connectable to the signal source, the feedback circuit being connected between the output and the second input and having a first feedback gain, the first amplifier having an open-loop gain; a second amplifier having first and second inputs, an output and a feedback circuit, the first input being connectable to the signal source; means for combining the outputs of the first and second amplifiers into a composite signal at a composite output terminal, the composite signal having a characteristic in a amount that is directly proportional to the amount of said characteristic at the output of the first amplifier plus the amount of said characteristic at the output of the second amplifier; wherein the composite output terminal is connectable to the load and wherein the feedback circuit of the second amplifier has a second feedback gain and is connected between the composite output terminal and the second input of the second amplifier; wherein the open-loop gain of the first amplifier multiplied by the first feedback gain is substantially greater than unity and wherein the first and second feedback gains are approximately identical.

BRIEF DESCRIPTION OF THE DRAWINGS

The preferred embodiment of the present invention will now be described with reference to the following figures, in which.

DETAILED DESCRIPTION OF THE PREFERRED EMBODIMENT

Figure 1A:
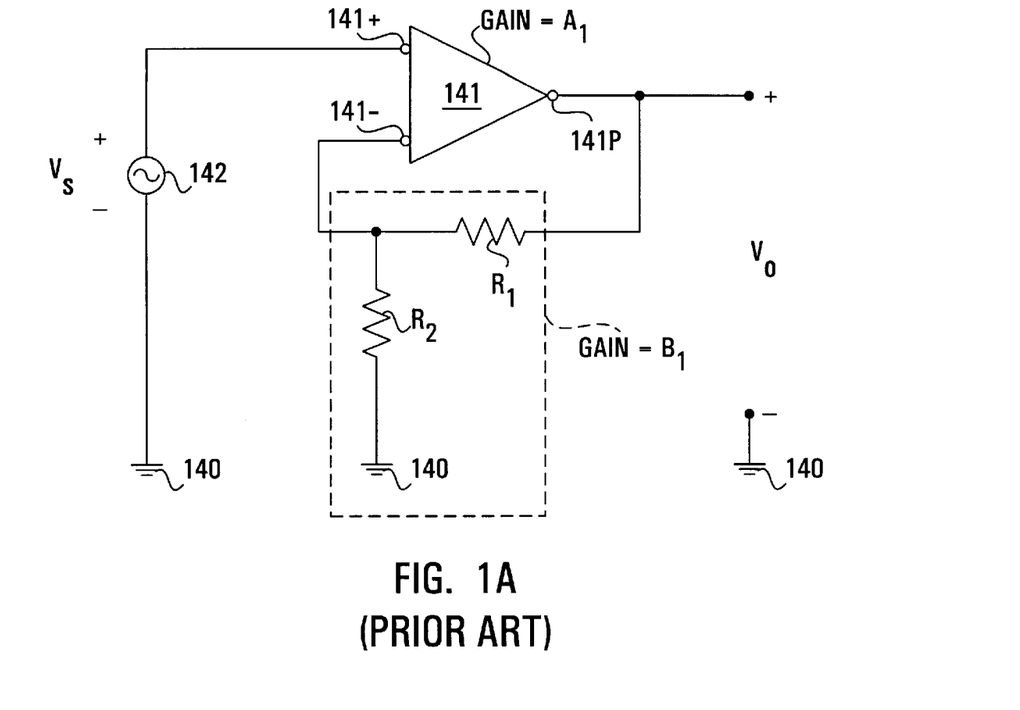
FIG. 1A illustrates a prior art amplifier configuration.

Referring to FIG. 1A, there is shown a prior art amplifier configuration comprising a conventional operational amplifier (opamp) 141 with an open-loop gain $A_1$ and having inverting and noninverting input terminals 141−,141+ as well as an output terminal 141P. The output terminal 141P of the opamp 141 is connected to a resistor $R_1$ which is in turn connected to another resistor $R_2$ and also to the opamp's inverting input terminal 141−. Resistor $R_2$ is connected to a ground reference 140, and its value is selectable so as to yield, in combination with a selectable value for $R_1$, a desired feedback gain $B_1=R_1/(R_1+R_2)$.

The opamp 141 is driven by a signal voltage source 142 having a time-varying electric potential, or voltage, $V_S$ relative to ground 140. An output voltage $V_O$ is measured between the output terminal 141P of the opamp 141 and the ground reference 140. Typically, the output voltage $V_O$ is connected across a load, such as an antenna or a loudspeaker.

Figure 1B:
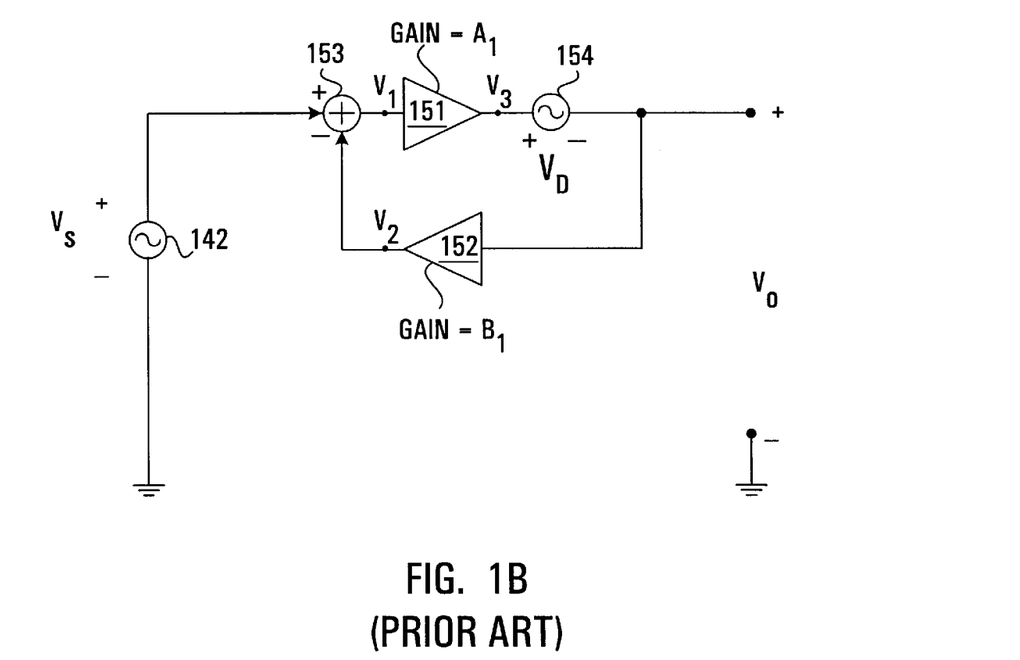
FIG. 1B is a signal diagram modelling the amplifier configuration in FIG. 1, including a signal voltage source and a distortion voltage source.

The prior art amplifier configuration in FIG. 1A can be analyzed in more depth with the aid of an equivalent signal diagram such as that shown in FIG. 1B, in which the opamp is modelled as a "perfect" forward gain element 151 in series with a distortion voltage source 154. The forward gain element 151 has a gain equal to the open-loop gain $A_1$ and produces an output voltage $V_3$ from an input voltage $V_1$. The distortion voltage source 154 adds a distortion voltage $V_D$ to the voltage $V_3$, producing the output voltage $V_O$. This output voltage $V_O$ is not only applied across a load but is also shown fed back to a subtracter 153 via a feedback gain element 152 providing the feedback gain $B_1$. The subtracter 153 subtracts the output voltage of the feedback gain element 152 from the signal voltage $V_S$ to yield the input voltage $V_1$ fed to the forward gain element 151.

An operational analysis of the signal diagram in FIG. 1B can be achieved using standard circuit analysis techniques. In determining the output voltage $V_O$, for example, it is helpful to consider the effect of either voltage source 142, 154 independently. This type of analysis is permitted because the circuit modelled in FIG. 1B is linear.

Figure 1C:
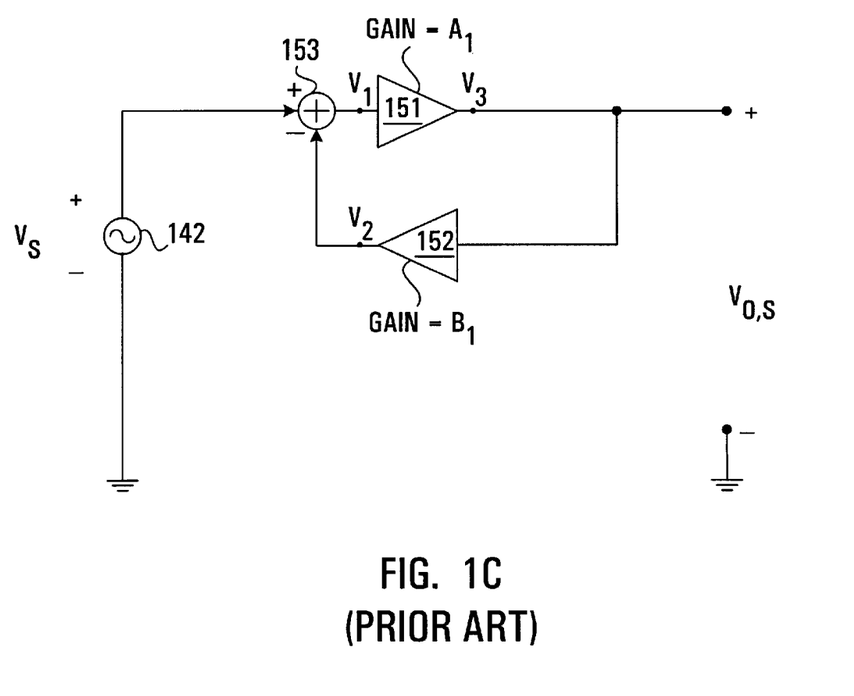
FIG. 1C shows the signal diagram of FIG. 1B with only the signal voltage source being enabled.

Reference is therefore made to FIG. 1C, in which only the signal voltage source 142 contributes to the output voltage $V_{O,S}$. The output voltage $V_{O,S}$ due to the signal voltage source 142 can be described implicitly by:

$$V_{O,S}=A_1V_1=A_1(V_S-B_1V_{O,S}).$$

Upon rearranging, one obtains:

$$V_{O,S} = V_S \frac{A_1}{(1+A_1B_1)}.$$

From this equation follows the well known fact that if the product of the open-loop gain $A_1$ with the feedback gain $B_1$ is sufficiently large, the overall gain can be controlled strictly by manipulating $B_1$, i.e., by selecting values for $R_1$ and $R_2$ in FIG. 1A.

Figure 1D:
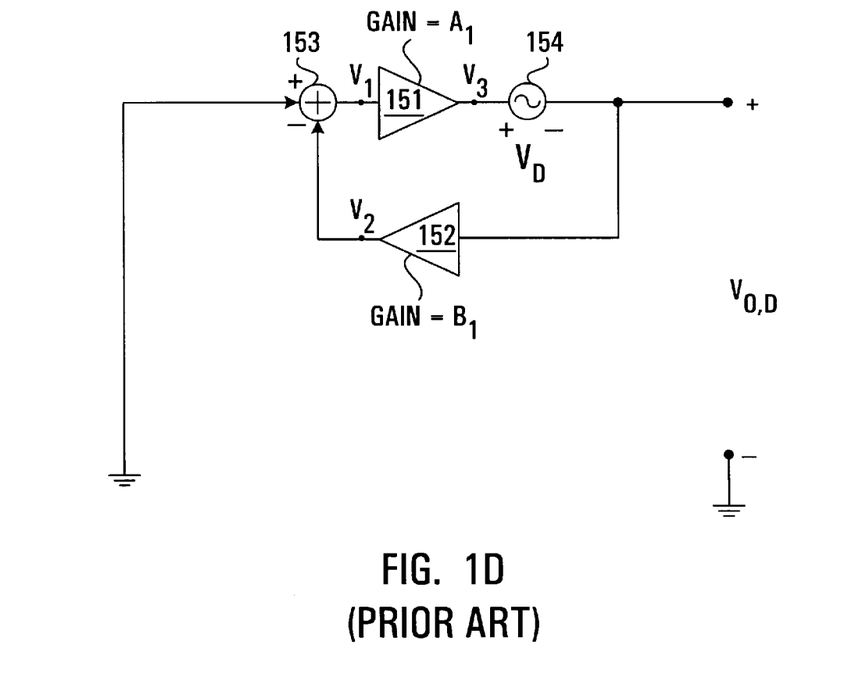
FIG. 1D shows the signal diagram of FIG. 1B with only the distortion voltage source being enabled.

Considering now the contribution of the distortion voltage source $V_D$ only, as illustrated in FIG. 1D, one notices that the output voltage $V_{O,D}$ due to the distortion voltage source 154 can be described by $V_3=V_D+V_{O,D}$. However, since $V_3=A_1V_1=-A_1B_1V_{O,D}$, one obtains:

$$V_{O,D} = V_D \frac{1}{(1+A_1B_1)}.$$

It is concluded that the induced distortion component is inversely proportional to the open-loop gain $A_1$. However, for many applications, and particularly those involving high frequencies, the open-loop gain $A_1$ is not high enough to reduce distortion to a level that is deemed acceptable.

Figure 2A:
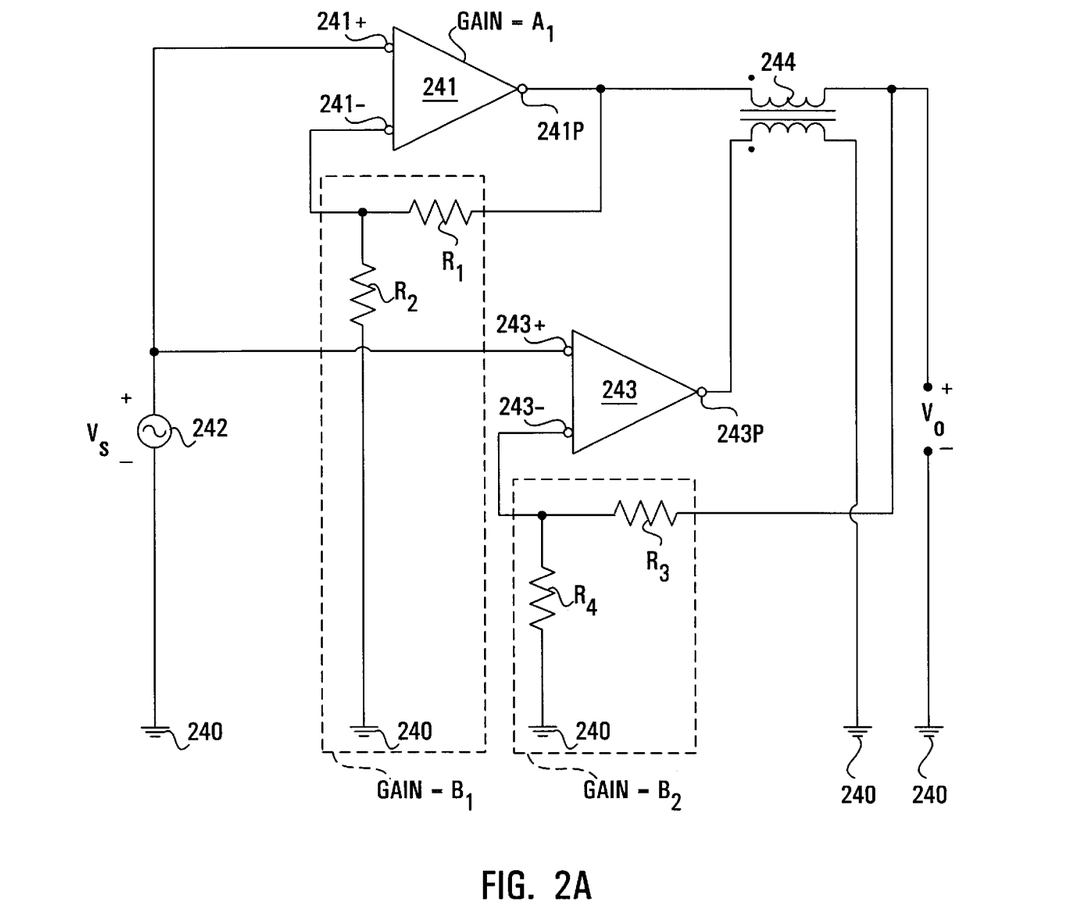
FIG. 2A illustrates an amplifier configuration in accordance with the preferred embodiment of the present invention.

On the other hand, the present invention is fully capable of providing the same overall signal gain as the prior art amplifier configuration, while significantly reducing the distortion component. To this end, FIG. 2A illustrates an amplifier configuration in accordance with the preferred embodiment of the present invention, comprising first and second opamps 241,243, a signal voltage source 242, four resistors $R_1$–$R_4$ and a transformer 244.

Opamps 241,243 have respective open-loop gains $A_1,A_2$ and each has respective inverting and noninverting input terminals −,+ and a respective output terminal P. The signal voltage source 242 provides a voltage $V_S$ to the noninverting input terminal of both opamps 241,243. The output terminal 241P of the first opamp 241 is an input to the transformer 244 and is also connected to resistor $R_1$, which in turn is connected both to resistor $R_2$ and to the inverting input terminal 241− of the first opamp 241. Resistor $R_2$ is connected to a ground reference 240 and in combination with $R_1$ and acts as a negative feedback circuit to provide the first opamp 241 with a controllable feedback gain $B_1=R_1/(R_1+R_2)$.

The output terminal 243P of the second opamp 243 is also an input to the transformer 244, which produces the output voltage $V_O$ by adding together the voltages output by both opamps 241,243. The transformer preferably has windings in a 1:1 ratio, although other ratios will work. The actual function of the transformer 244 is to make one of its input voltages, in this case the voltage at port 243P of the second opamp, float with respect to ground. It is to be understood that this can also be achieved through the use of other known voltage addition devices.

The output voltage $V_O$ is also used in a feedback path, via resistor $R_3$, to the inverting input terminal 243P of the second opamp 243. Resistor $R_4$ is connected to ground 240 and to resistor $R_3$, with which it acts as a negative feedback loop having a controllable feedback gain $B_2=R_3/(R_3+R_4)$ provided to the second opamp 243.

It is observed that the amplifier configuration in FIG. 2A comprises all of the elements of the amplifier configuration in FIG. 1A, in addition to the inventive connection of the summer 244, second opamp 243 and resistors $R_3$, $R_4$. As will now be shown, careful selection of $R_3$ and $R_4$ can advantageously reduce the distortion due to opamp 241. To this end, FIG. 2B shows an equivalent signal diagram modelling the amplifier configuration of FIG. 2A, in which abstraction has been made from the opamps, these having been replaced by combinations of forward and feedback gain elements.

Specifically, the first opamp is modelled as a perfect forward gain element 251, producing a voltage $V_3$ from an input voltage $V_1$, in series with a distortion voltage source 254, which adds a voltage $-V_{D1}$ to the voltage $V_3$ to produce a voltage $V_4$. The forward gain element 251 has a gain $A_1$ equal to the open-loop gain of the first opamp. A feedback gain element 252 applies the feedback gain $B_1$ to the voltage $V_4$, thereby to produce a voltage $V_2$ that is fed to a subtracter 253. The subtracter 253 subtracts the voltage $V_2$ from the signal voltage $V_S$ produced by the signal voltage source 242 to give the input voltage $V_1$.

The second opamp is similarly modelled by a perfect forward gain element 255, producing a voltage $V_8$ from a voltage $V_5$. The gain element 255 is placed in series with a distortion voltage source 258, which adds a voltage $-V_{D2}$ to the voltage $V_8$ to produce a voltage $V_7$. The forward gain element 255 has a gain $A_2$ equal to the open-loop gain of the second opamp 43. The voltage $V_7$ is added to the voltage $V_4$ at the summer 244, which produces the output voltage $V_O$. This output voltage is also fed back via a feedback gain element 256 producing a voltage $V_6$ to another subtracter 257. The subtracter 257 subtracts the voltage $V_6$ from the signal voltage $V_S$ to yield the voltage $V_5$ fed to the forward gain element 255.

Figure 2B:
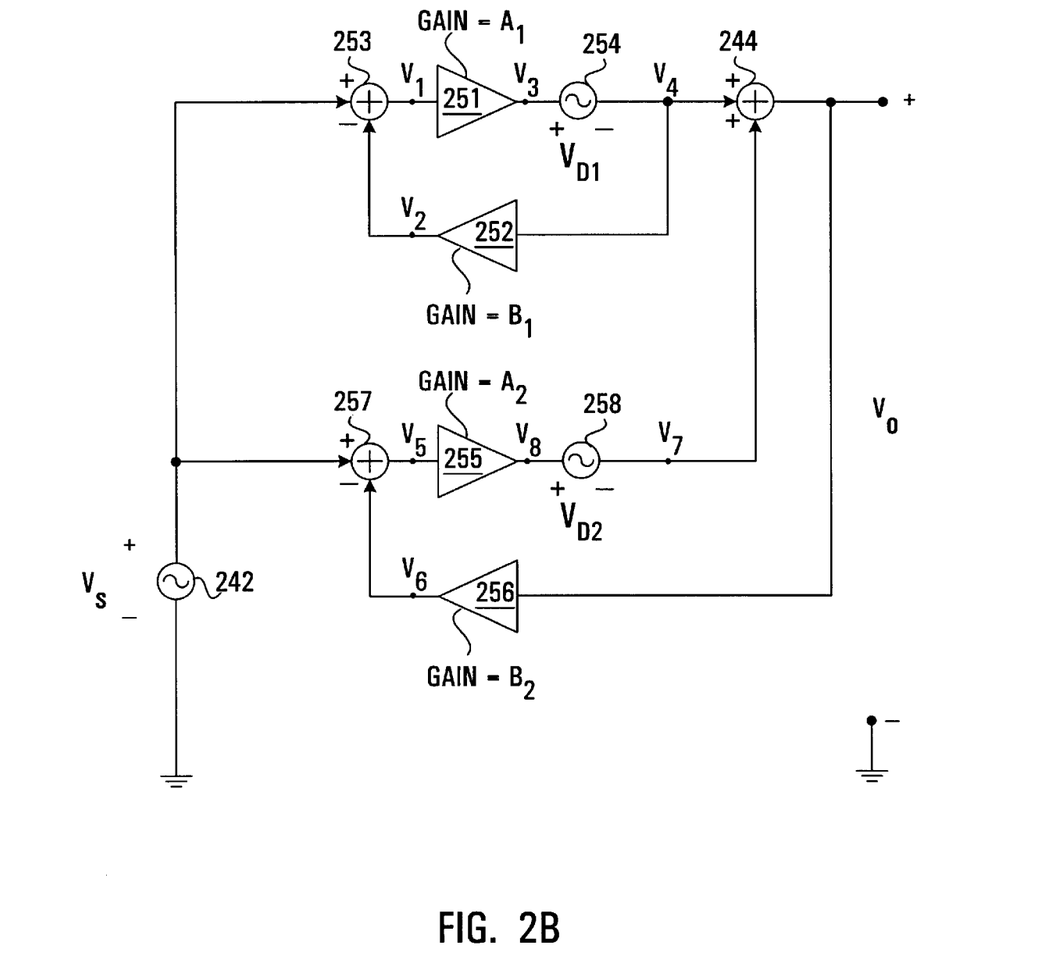
FIG. 2B is a signal diagram modelling the amplifier configuration in FIG. 2A, including a signal voltage source and two distortion voltage sources.
Figure 2C:
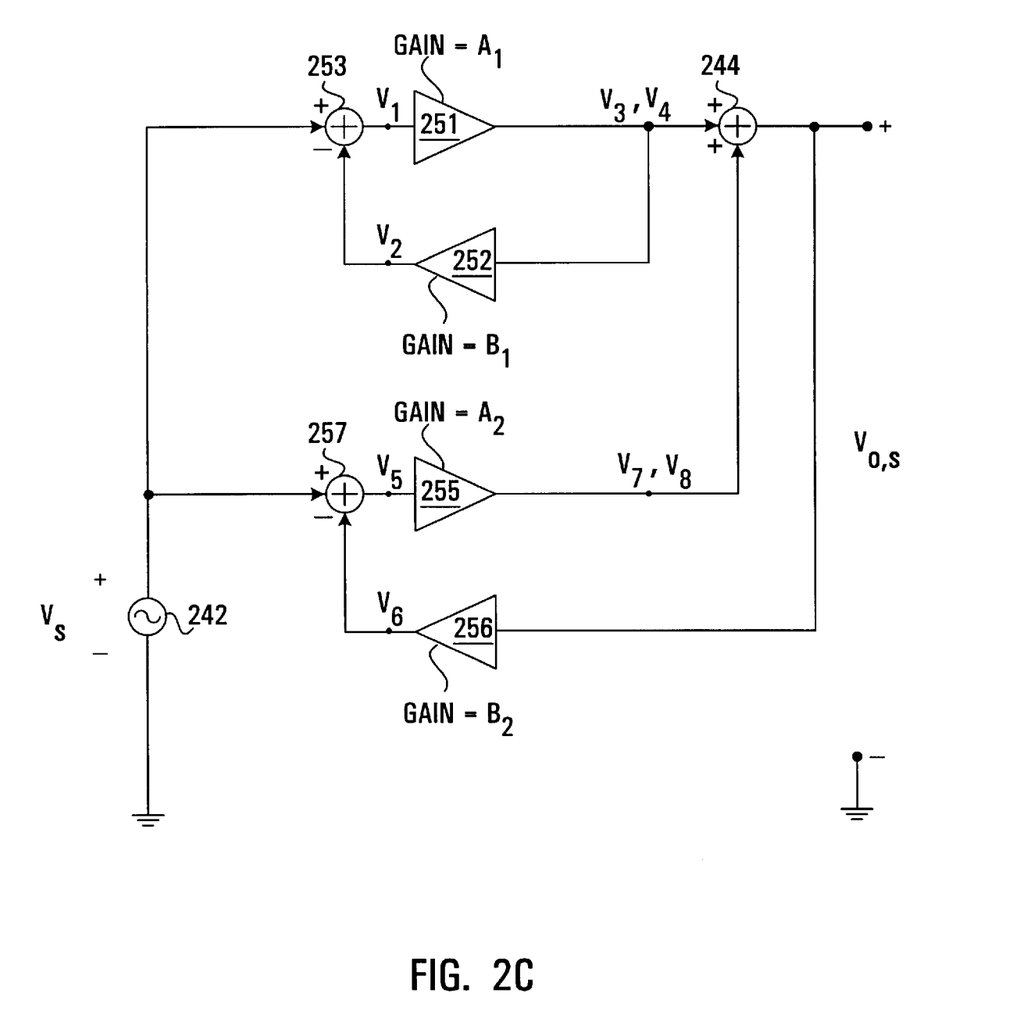
FIG. 2C shows the signal diagram of FIG. 2B with only the signal voltage source being enabled.

Operation of the inventive amplifier configuration using the (linear) signal diagram in FIG. 2B is best described by separately considering the contributions to the output voltage of the signal voltage source 242 and of the distortion voltage sources 254,258. From the signal diagram in FIG. 2C, illustrating the contribution of the signal voltage source 242 only, a set of equations can be derived to obtain the output voltage $V_{O,S}$ due to this source only. Firstly, one has:

$$V_3 = A_1 V_1 = A_1(V_S - B_1 V_3)$$

from which:

$$V_3 = V_S \frac{A_1}{(1 + A_1 B_1)}.$$

Next, one has:

$$V_7 = A_2 V_5 = A_2(V_S - B_2 V_{O,S}).$$

Finally, it is noted that $V_{O,S} = V_3 + V_7$, from which it can be shown that:

$$V_7 = V_{O,S} \frac{1 - \frac{A_1 B_1}{1 + A_1 B_1}}{\frac{1}{A_2} - 1}.$$

A crucial step is to require that $A_1 B_2 \cong 1 + A_1 B_1$, thereby making the voltage $V_7$ approximately equal to zero, according to equation (1). In this case, $V_{O,S}$ is approximately equal to $V_3$, that is to say:

$$V_{O,S} \simeq V_S \frac{A_1}{1 + A_1 B_1}$$

providing the same overall signal gain as that of the prior art amplifier configuration in FIG. 1A.

Although it is possible to control $B_1$ and/or $B_2$ by modifying the values of the corresponding pair of resistors, the open-loop gain $A_1$ is typically a parameter that is determined by the internal construction of the operational amplifier 241. Nevertheless, when $A_1 B_1$ is large enough (e.g., on the order of 4 or more), $1 + A_1 B_1$ is approximately equal to $A_1 B_1$, and the condition for $V_7 \cong 0$ simply becomes $B_1 \cong B_2$. Also noteworthy is the fact that it is not crucial for $V_7$ to be approximately equal to zero in order that the inventive amplifier configuration provide advantageous operation over the prior art. A useful range for $B_1$ and $B_2$ is defined by an acceptable range for the closed-loop gains of the two amplifiers, that is to say:

$$\left\{ B_1, B_2 : 1 \le \frac{A_2}{A_1} \frac{(1 + A_1 B_1)}{(1 + A_2 B_2)} \le 2 \right\}.$$

When $A_1$ and $A_2$ are sufficiently large, B1 and B2 should satisfy the relationship $$1 \le \frac{B_1}{B_2} \le 2.$$

Of course, due to varying device characteristics, the lower and upper bounds can respectively extend to 0.75 and 4 whilst maintaining an acceptable level of performance.

Figure 2D:
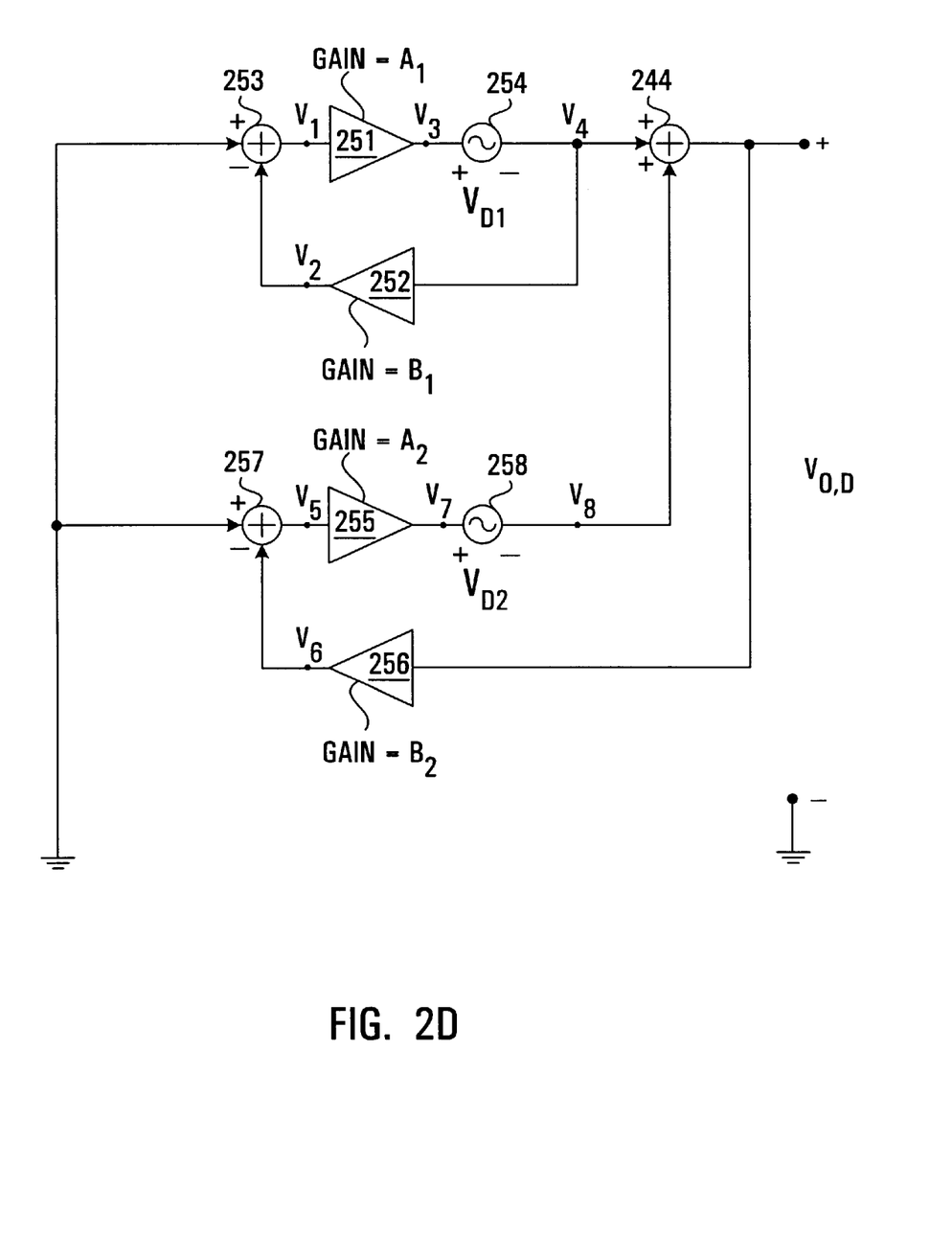
FIG. 2D shows the signal diagram of FIG. 2B with only the distortion voltage sources being enabled.

Reference is now made to FIG. 2D, in which is shown the signal diagram of FIG. 2B with the signal voltage source having been short-circuited, thereby to illustrate the output voltage $V_{O,D}$ due to the distortion sources 254,258 only. Another set of equations can be derived as follows:

$$V_8 = V_{O,D} - V_4$$

$$V_7 = V_8 - V_{D2}$$

from which it follows that:

$$V_7 = -V_{D2} + V_{O,D} - V_4.$$

At the same time, it is clear that:

$$V_7 = -A_2 B_2 V_{O,D}.$$

Setting both expressions for $V_7$ equal to one another, one can solve for $V_{O,D}$:

$$V_{O,D} = \frac{V_4}{1 + A_2 B_2} + \frac{V_{D2}}{1 + A_2 B_2}.$$

An expression for $V_4$ is easily derived as:

$$V_4 = \frac{V_{D1}}{1 + A_1 B_1},$$

leading to an expression for the contribution of the distortion voltage sources 254,258 to the output voltage:

$$V_{O,D} = \frac{V_{D1}}{(1 + A_1 B_1)(1 + A_2 B_2)} + \frac{V_{D2}}{1 + A_2 B_2}. \tag{2}$$

From equation (2), it is seen that the contribution of distortion voltage source 254 is $(1 + A_2 B_2)$ times less than was the case in the prior art. As for the contribution of distortion voltage source 258, it is crucial to recognize that having inventively selected $B_1 \cong B_2$, the signal component of $V_7$ is kept close to zero, and therefore $V_{D2}$, which is related to $V_7$, is much smaller than $V_{D1}$ to begin with, requiring less attenuation to give an acceptable level of distortion.

It can therefore be concluded that the inventive amplifier configuration in FIG. 2A provides the same signal gain as that of prior art, while offering the advantage of significantly less distortion. While the preferred embodiment of the present invention has been described and illustrated, it will be apparent to one skilled in the art that numerous modifications and variations are possible. For example, the opamps 241,243 in FIG. 2A may be replaced by any multi-terminal device (e.g., a current-mode opamp) which controllably amplifies the difference in potential between two of its terminals.

Moreover, the feedback path created by voltage division using resistor pairs $R_1, R_2$ and $R_3, R_4$ can be provided by other feedback circuits capable of applying a controllable gain to the output of the first opamp 241 and to the output voltage, respectively. Such circuits may include the use of capacitors or inductors when frequency response shaping of the input-output response is desired. Still other types of feedback circuits may employ transformers.

Figure 3A:
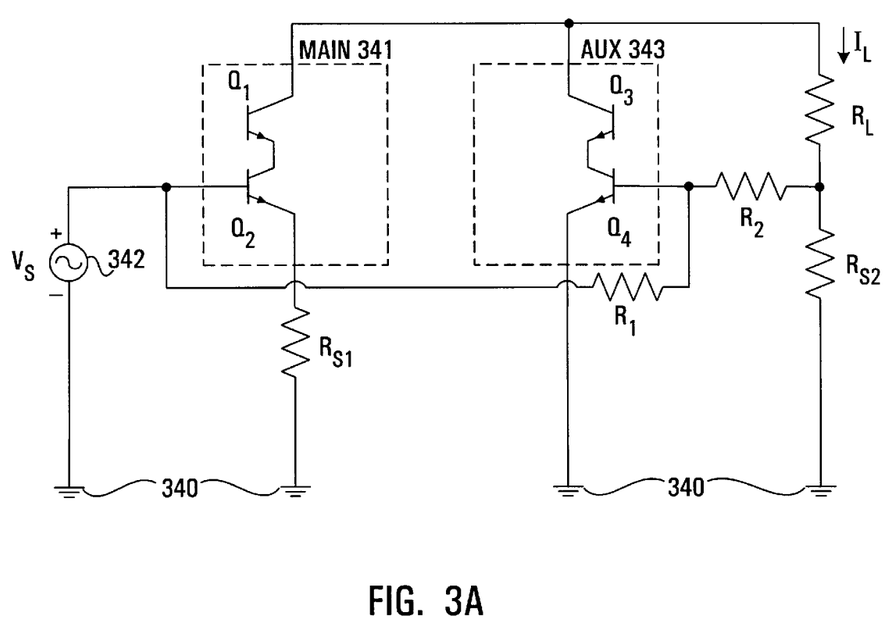
FIG. 3A illustrates an amplifier configuration in accordance with an alternate embodiment of the present invention.

Also, it is possible to construct an amplifier circuit which provides the same advantages as that of FIG. 2A, but which relies on controllable current sources instead of voltage amplifiers. For example, FIG. 3A shows an alternate embodiment of the present invention, comprising a signal voltage source 342 providing a signal voltage $V_S$ to both a main amplifier 341 and an auxiliary amplifier 343. The main and auxiliary amplifiers 341,343 comprise NPN bipolar junction transistor (BJT) pairs $Q_1,Q_2$ and $Q_3,Q_4$ arranged as current sources controlled by the signal voltage $V_S$. Specifically, the base of transistor $Q_2$ is connected to the voltage source 342, the emitter of transistor $Q_2$ is connected to a first sensing resistor $R_{S1}$ (connected to a ground reference 340) and the collector of transistor $Q_2$ is connected to the emitter of transistor $Q_1$. The base of transistor $Q_1$ is assumed to be appropriately biased and the collector of transistor $Q_1$ is connected both to the collector of transistor $Q_3$ in the auxiliary amplifier 343 and to a load resistor $R_L$.

In the auxiliary amplifier 343, the base of transistor $Q_3$ is assumed to be suitably biased and its emitter is connected to the collector of transistor $Q_4$. The emitter of transistor $Q_4$ is connected to ground 340 and its base is connected in parallel to a pair of resistors $R_1$ and $R_2$. Resistor $R_1$ is fed back to the base of transistor $Q_2$ in the main amplifier 341 and resistor $R_2$ leads to two resistors in series, one being the load resistor $R_L$ and the other being a second sensing resistor $R_{S2}$ connected to ground 340. The resistors $R_1$ and $R_2$ provide a negative feedback path to the auxiliary amplifier 343 having a controllable feedback gain $K_2$. No voltage division exists between the load and the base of transistor $Q_2$, i.e., the feedback gain $K_1$ provided to the main amplifier is unity.

In the embodiment of FIG. 3A, the voltage at the base of $Q_2$ and $Q_4$ modifies the current flowing through the collectors and emitters of the corresponding transistor pair. It is reasonable to assume that the amount of current entering the base of transistors $Q_2$ and $Q_4$ is negligible. It is also to be considered that other voltage-controlled current source configurations can be suitably employed instead of the amplifiers 341,343.

Figure 3B:
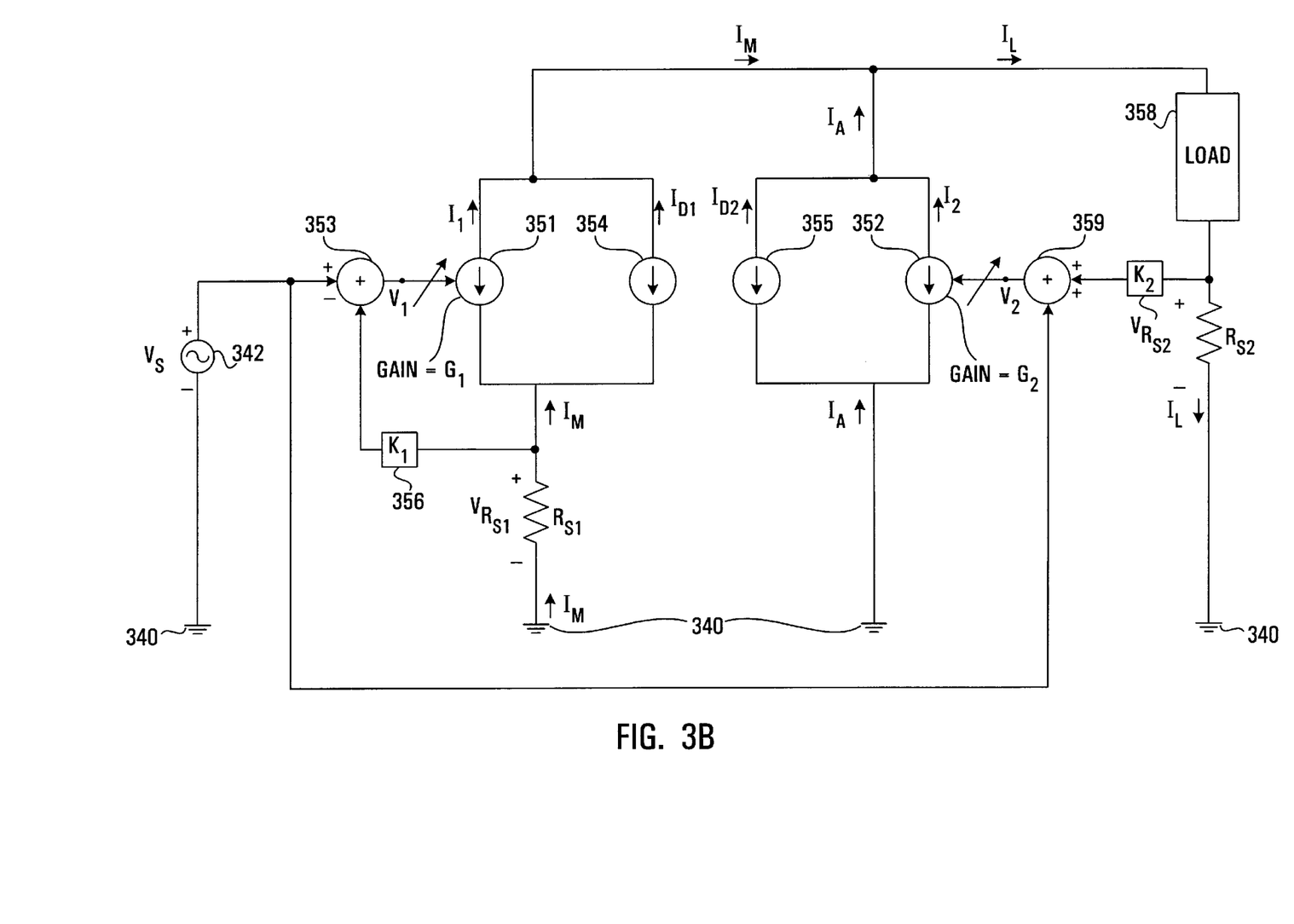
FIG. 3B is a signal diagram modelling the amplifier configuration in FIG. 3A, including a signal voltage source and two distortion current sources.

Regardless of the type of voltage-controlled current source used for the amplifiers 341,343, the circuit of FIG. 3A can be represented by the signal diagram in FIG. 3B. Specifically, the main amplifier 341 is modelled as a controllable current source 351 which supplies a current $I_1$ that is proportional by a factor $G_1$ to an input voltage $V_1$ present at a control terminal. The input voltage $V_1$ is provided by a subtracter 353 which determines the difference between the voltage $V_S$ and a voltage $V_{R_{S1}}$ across the sensing resistor $R_{S1}$ times the feedback gain $K_1$ (which generally differs from unity, although not in this particular example). To model the distortion produced by the main amplifier, a first distortion current source 354 providing a distortion current $I_{D1}$ is placed in parallel therewith. This distortion current will tend to be a non-negligible fraction of the current $I_1$.

The auxiliary amplifier 343 is similarly modelled as a controllable current source 352 supplying a current $I_2$ which is proportional by a factor $G_2$ to an input voltage $V_2$ present at a control terminal of the current source and emanating from a summer 359. Distortion induced by the auxiliary amplifier is modelled by another current source 355 producing a current $I_{D2}$. The cumulative current $I_A$ leaving the auxiliary amplifier is joined with the cumulative current $I_M$ leaving the main amplifier to give a total current $I_L$ which traverses a load 358. The current $I_L$ passing through the load 350 also passes through sensing resistor $R_{S2}$ on its way to ground 340. The resulting voltage $V_{R_{S2}}$ across sensing resistor $R_{S2}$ is multiplied by the feedback gain $K_2$ and added by the summer 359 to the source voltage $V_S$ yielding the voltage $V_2$ input to the control terminal of current source 352.

Upon comparing the signal diagram of FIG. 3B with the circuit of FIG. 3A, the various parameters can be matched as follows:

| FIG. 3B | FIG. 3A |
|---|---|
| $K_1$ | 1 |
| $K_2$ | $R_1/(R_1 + R_2)$ |
| $G_1$ | transconductance of $Q_2$ |
| $G_2$ | transconductance of $Q_4$ |
| load | $R_L$ |

Figure 3C:
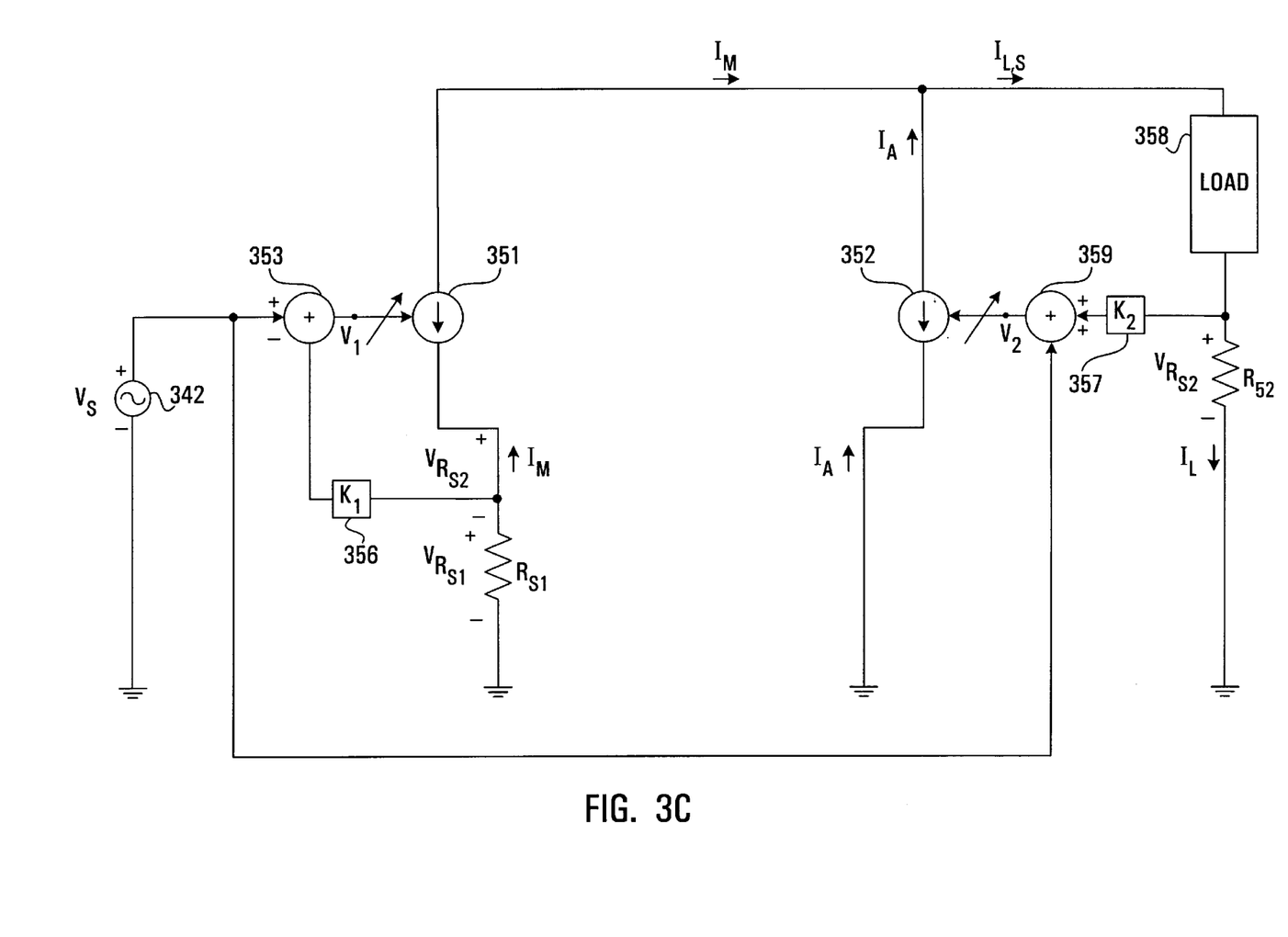
FIG. 3C shows the signal diagram of FIG. 3B with only the signal voltage source being enabled.

Analysis of the diagram in FIG. 3B is now undertaken by separately considering contributions of the signal (i.e., the signal voltage source 342 providing a voltage $V_S$) and of the distortion (i.e., the distortion current sources 354,355 providing currents $I_{D1}$ and $I_{D2}$) Firstly, FIG. 3C considers only the signal components by open-circuiting both distortion current sources. By inspection, the load current $I_{L,S}$ due only to the voltage source $V_S$ is the sum of the currents $I_M$ and $I_A$ respectively leaving the main and auxiliary amplifiers. Deriving an equation for $I_M$, one has:

$$I_M = G_1(V_S - K_1 V_{R_{S1}}) = G_1(V_S - K_1(-I_M)R_{S1}),$$

which, after rearranging, becomes:

$$I_M = V_S \frac{G_1}{1 - G_1 K_1 R_{S1}}. \quad (3)$$

It is also possible to derive an equation for $I_A$:

$$I_A = G_2(V_S + K_2 V_{R_{S2}}) = G_2(V_S + K_2 I_L R_{S2})$$

and knowing that $I_L = I_M + I_A$, one obtains:

$$I_A = \frac{G_2 V_S + G_2 K_2 I_M R_{S2}}{1 - G_2 K_2 R_{S2}}.$$

Finally, after inserting equation (3) for $I_M$, this becomes:

$$I_A = \frac{G_2 V_S + G_2 K_2 \left[\dfrac{G_1 V_S}{1 - G_1 K_1 R_{S1}}\right] R_{S2}}{1 - G_2 K_2 R_{S2}}. \quad (4)$$

It should now be apparent that if $-K_2 G_1 R_{S2} = 1 - K_1 G_1 R_{S1}$, in accordance with the present invention, then $I_A = 0$, i.e., the auxiliary amplifier does not produce any current whatsoever and therefore the signal current traversing the load is:

$$I_{L,S} = I_M = V_S \frac{G_1}{1 - G_1 K_1 R_{S1}}.$$

While $G_1$ is difficult to control, and may be quite low at high frequencies, it is usually possible to select $K_1$ and $R_{S1}$ such that $1 - K_1 G_1 R_{S1}$ is approximately equal to $-K_1 G_1 R_{S1}$, for instance when $K_1 G_1 R_{S1} \geq 4$, in which case $I_A$ in equation (4) is close to zero when $K_2 R_{S2} \cong K_1 R_{S1}$. In an manner analogous to the voltage amplifier configuration discussed previously, IA need not be negligible in order for the inventive amplifier configuration to function advantageously with respect to the prior art. Specifically, $K_1$, $R_{S1}$, $K_2$ and $R_{S2}$ need simply satisfy:

$$\left\{ K_1, K_2, R_{S1}, R_{S2} : 1 \le \frac{G_2}{G_1} \frac{(1 - G_1 K_1 R_{S1})}{(1 - G_2 K_2 R_{S2})} \le 2 \right\}.$$

When $G_1$ and $G_2$ are sufficiently large, the limits for $K_1$, $R_{S1}$, $K_2$ and $R_{S2}$ become:

$$1 \le \frac{K_1 R_{S1}}{K_2 R_{S2}} \le 2,$$

although variations in circuit components may extend the lower and upper bounds to 0.75 and 4, respectively.

Figure 3D:
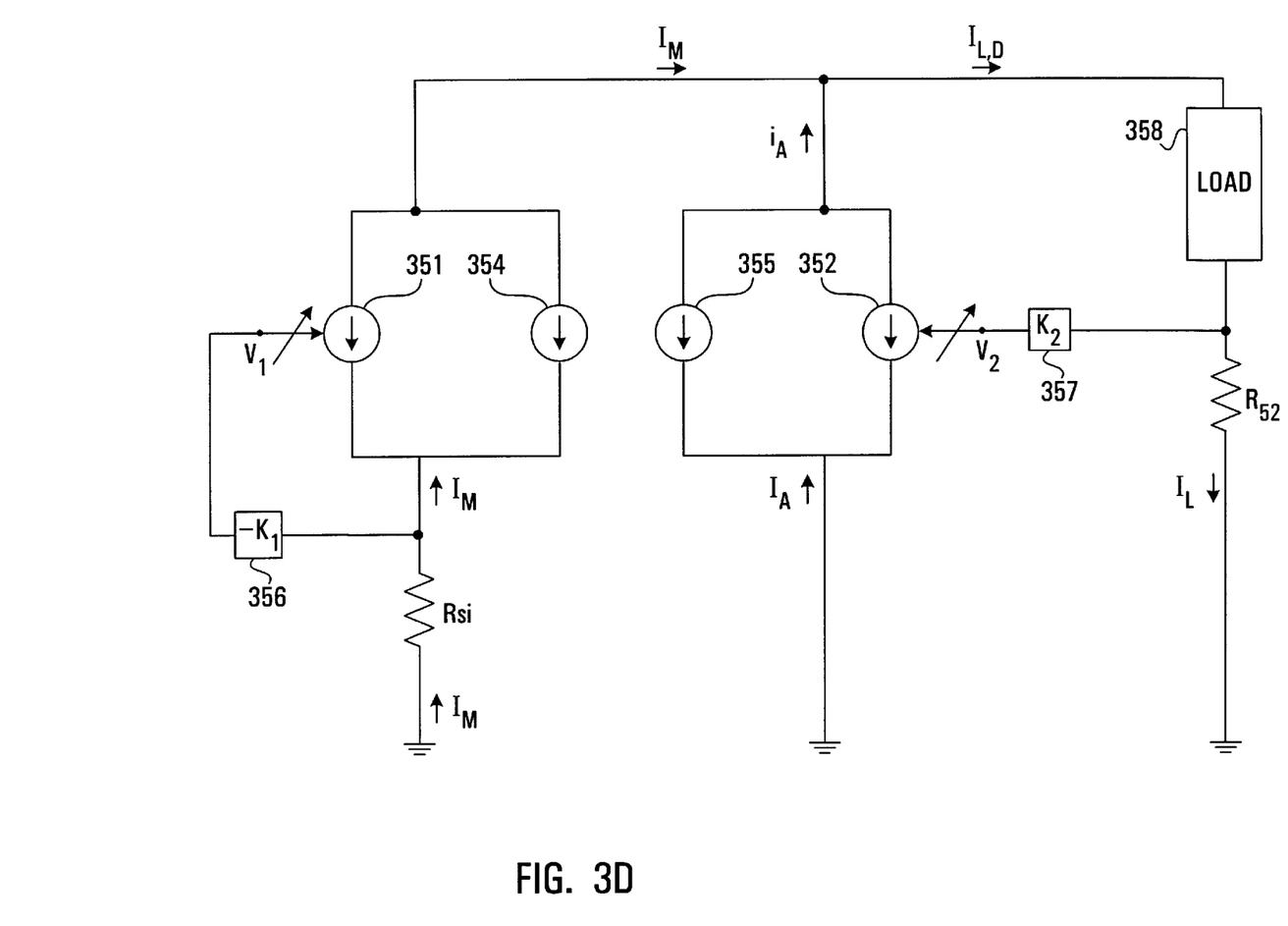
FIG. 3D shows the signal diagram of FIG. 3B with only the distortion current sources being enabled.

The contribution of the distortion current sources is now considered with reference to FIG. 3D, in which the signal voltage $V_S$ has been set to zero. The subtracter (353 in FIG. 3B) reduces to an inverter and its functionality has been incorporated into the feedback gain element 356 which now provides a feedback gain $-K_1$. The load current $I_{L,D}$ due only to the distortion sources 354,355 is equal to the sum of the currents $I_M$ and $I_A$ Mathematically, the current $I_M$ can be found from:

$$I_M = -I_{D1} - G_1 V_1 = -I_{D1} - G_1((-K_1)(-I_M)R_{S1}). \quad (5)$$

After rearranging, this gives:

$$I_M = \frac{-I_{D1}}{1 + G_1 K_1 R_{S1}}.$$

An expression can also be derived for $I_A$:

$$I_A = -I_{D2} - G_2 V_2 = -I_{D2} - G_2 K_2 I_L R_{S2} = -I_{D2} - G_2 K_2 (I_A + I_M) R_{S2}$$

which yields, after rearranging:

$$I_A = \frac{-I_{D2}}{1 + K_2 G_2 R_{S2}} - \frac{I_M}{1 + K_2 G_2 R_{S2}}.$$

After inserting the result of equation (5) for $I_M$, one has:

$$I_A = \frac{-I_{D2}}{1 + K_2 G_2 R_{S2}} + \frac{I_{D1}}{(1 + K_1 G_1 R_{S1})(1 + K_2 G_2 R_{S2})}.$$

From equation (6), it is clear that the distortion component due to the distortion source 354 is reduced by a factor of $(1+K_1 G_1 R_{S1})(1+K_2 G_2 R_{S2})$. Moreover, while it would appear that the distortion component due to distortion source 355 is only reduced by a factor of $(1+K_2 G_2 R_{S2})$, it is to be considered that if $K_1$, $K_2$, $R_{S1}$ and $R_{S2}$ are chosen as above, i.e., if $K_2 R_{S2}$ is approximately equal to $K_1 R_{S1}$ then the signal component of $V_2$ will be relatively small, leading to a relatively small distortion current $I_{D2}$. It is readily observed that the present invention in the alternate provides distortion suppression comparable to that of the preferred embodiment.

It is to be understood that the advantages brought on by the inventive amplifier configuration in FIG. 3A do not require usage of the specific components illustrated and that different components may be used without departing from the spirit of the present invention. For instance, it may be appropriate to use PNP BJTs or field-effect transistors (FETs) instead of the NPN BJT transistors $Q_1$–$Q_4$ depicted in FIG. 3A. When a pair of BJT transistors are placed in a so-called common-base configuration (or when two FET transistors are placed in a "common-gate" configuration), the current source thus created produces a current which varies as a function of a control current instead of a control voltage. Such "current-controlled current sources" are also appropriate for implementing the present invention.

In view of the many further possible variations of the present invention, it is to be understood that its scope is only to be limited by the claims appended hereto.

We claim:

1. An amplifier circuit for connection to a voltage source and to first and second terminals of a load, comprising:

a main current source, having a first signal terminal for connection to the first terminal of the load, a second signal terminal and a control terminal for connection to the voltage source, the main current source having a gain ($G_1$);

a first sensing resistor connected between the second signal terminal of the main current source and for connection to a reference voltage, the first sensing resistor having a resistance ($R_{S1}$);

an auxiliary current source, having a first signal terminal for connection to the first terminal of the load, a second signal terminal for connection to the reference voltage and a control terminal; and a second sensing resistor for connection between the second terminal of the load and the reference voltage, the second sensing resistor having a resistance (RS2); and a feedback circuit for connection to the second terminal of the load and connected to the control terminals of the main and auxiliary current sources for providing first and second feedback gains ($K_1$, $K_2$) to the first and second current sources, respectively;

wherein $G_1 K_1 R_{S1}$ is substantially greater than unity and wherein $$\frac{K_1 R_{S1}}{K_2 R_{S2}}$$

lies between approximately 0.75 and approximately 4;

wherein the elements in the feedback circuit are chosen such that the current produced by the auxiliary current source is substantially equal to a distorted portion of the current produced by the main current source so that the current produced by the auxiliary current source cancels out the distorted portion of the current produced by the main current source.

2. An amplifier according to claim 1, wherein the feedback circuit consists of a voltage divider circuit comprising first and second feedback resistors connected in series between the second terminal of the load and the control terminal of the main current source, the junction of the first and second resistors being connected to the control terminal of the auxiliary current source.

3. An amplifier according to claim 1, wherein the main and auxiliary current sources each comprise a pair of bipolar junction transistors (BJTs);

wherein one of the BJTs in the main current source has its collector connected to the first signal terminal of the main current source and has its emitter connected to the collector of the other BJT in the main current source and to the control terminal of the main current source, wherein the other BJT in the main current source has its emitter connected to the second signal terminal of the main current source;

wherein one of the BJTs in the auxiliary current source has its collector connected to the first signal terminal of the auxiliary current source and has its emitter connected to the collector of the other BJT in the auxiliary current source and to the control terminal of the auxiliary current source, and wherein the other BJT in the auxiliary current source has its emitter connected to the second signal terminal of the auxiliary current source.

4. An amplifier according to claim 1, wherein $G_1 K_1 R_{S1}$ is greater than four, wherein the second amplifier has an open-loop gain ($A_2$) and wherein $K_1$, $K_2$ are selected to satisfy $$1 \le \frac{G_2}{G_1} \frac{(1 - G_1 K_1 R_{S1})}{(1 - G_2 K_2 R_{S2})} \le 2.$$

5. An amplifier circuit for connection to a voltage source and to first and second terminals of a load, comprising:
- a main current source, having a first signal terminal for connection to the first terminal of the load, a second signal terminal, and a control terminal for connection to the voltage source, the main current source having a gain ($G_1$);
- a first sensing resistor connected between the second signal terminal of the main current source and for connection to a reference voltage, the first sensing resistor having a resistance ($R_{S1}$);
- an auxiliary current source, having a first signal terminal for connection to the first terminal of the load, a second signal terminal for connection to the reference voltage and a control terminal; and
- a second sensing resistor for connection between the second terminal of the load and the reference voltage, the second sensing resistor having a resistance ($R_{S2}$); and
- a feedback circuit for connection to the second terminal of the load and connected to the control terminals of the main and auxiliary current sources for providing first and second feedback gains ($K_1$, $K_2$) to the first and second current sources, respectively;
- wherein the elements in the feedback circuit are chosen such that the current produced by the auxiliary circuit source is substantially equal to a distorted portion of the current produced by the main current source so that the current produced by the auxiliary circuit source cancels out the distorted portion of the output current produced by the main current source.

6. An amplifier according to claim 5, wherein $G_1 K_1 R_{S1}$ is substantially greater than unity.

7. An amplifier according to claim 6, wherein $$\frac{K_1 R_{S1}}{K_2 R_{S2}}$$

lies between approximately 0.75 and approximately 4.

8. An amplifier according to claim 5, wherein the feedback circuit consists of a voltage divider circuit comprising first and second feedback resistors connected in series between the second terminal of the load and the control terminal of the main current source, the junction of the first and second resistors being connected to the control terminal of the auxiliary current source.

9. An amplifier according to claim 5, wherein the main and auxiliary current sources each comprise a pair of bipolar junction transistors (BJTs);
- wherein one of the BJTs in the main current source has its collector connected to the first signal terminal of the main current source and has its emitter connected to the collector of the other BJT in the main current source and to the control terminal of the main current source, wherein the other BJT in the main current source has its emitter connected to the second signal terminal of the main current source;
- wherein one of the BJTs in the auxiliary current source has its collector connected to the first signal terminal of the auxiliary current source and has its emitter connected to the collector of the other BJT in the auxiliary current source and to the control terminal of the auxiliary current source, and wherein the other BJT in the auxiliary current source has its emitter connected to the second signal terminal of the auxiliary current source.

10. An amplifier according to claim 5, wherein $G_1 K_1 R_{S1}$ is greater than four, wherein the second amplifier has an open-loop gain ($A_2$) and wherein $K_1$, $K_2$ are selected to satisfy $$1 \le \frac{G_2}{G_1} \frac{(1 - G_1 K_1 R_{S1})}{(1 - G_2 K_2 R_{S2})} \le 2.$$

11. An amplifier circuit, comprising:
- a first current source, for producing a first output current having both a distorted portion and an undistorted portion that is a linear function of an input voltage; and
- a second current source connected in a feedback loop and also connected to the first current course, for producing a second output current as a function of the input voltage, the first output current and a set of elements in the feedback loop;
- wherein the elements in the feedback loop are chosen such that the second output current is substantially equal to the distorted portion of the first output current, so that the second output current cancels out the distorted portion of the first output current.

* * * * *